(12) United States Patent
Wang et al.

(10) Patent No.: US 7,339,275 B2
(45) Date of Patent: Mar. 4, 2008

(54) MULTI-CHIPS SEMICONDUCTOR DEVICE ASSEMBLIES AND METHODS FOR FABRICATING THE SAME

(75) Inventors: James Jen Ho Wang, Phoenix, AZ (US); Justin E. Poarch, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 115 days.

(21) Appl. No.: 10/995,818

(22) Filed: Nov. 22, 2004

(65) Prior Publication Data
US 2006/0108697 A1 May 25, 2006

(51) Int. Cl.
*H01L 23/48* (2006.01)

(52) U.S. Cl. .............. 257/777; 257/686; 257/E25.013; 438/108; 438/109

(58) Field of Classification Search ........ 438/108–109; 257/686, 777, 778, E21.503
See application file for complete search history.

(56) References Cited

U.S. PATENT DOCUMENTS

| | | | | |
|---|---|---|---|---|
| 5,554,940 | A * | 9/1996 | Hubacher .................... | 324/765 |
| 6,020,640 | A * | 2/2000 | Efland et al. ................ | 257/751 |
| 6,150,724 | A * | 11/2000 | Wenzel et al. .............. | 257/777 |
| 6,187,615 | B1 * | 2/2001 | Kim et al. ................... | 438/113 |
| 6,258,626 | B1 * | 7/2001 | Wang et al. ................. | 438/107 |
| 6,376,279 | B1 * | 4/2002 | Kwon et al. ................. | 438/113 |
| 6,407,459 | B2 * | 6/2002 | Kwon et al. ................. | 257/780 |
| 6,492,198 | B2 * | 12/2002 | Hwang ......................... | 438/108 |
| 6,534,853 | B2 * | 3/2003 | Liu et al. ..................... | 257/692 |
| 6,674,162 | B2 * | 1/2004 | Takao .......................... | 257/700 |
| 6,768,190 | B2 * | 7/2004 | Yang et al. .................. | 257/686 |
| 6,921,968 | B2 * | 7/2005 | Chung ......................... | 257/686 |
| 6,933,524 | B2 * | 8/2005 | Hembree et al. ............. | 257/48 |
| 6,964,889 | B2 * | 11/2005 | Ma et al. ..................... | 438/127 |
| 6,987,031 | B2 * | 1/2006 | Eng et al. .................... | 438/108 |
| 6,995,038 | B2 * | 2/2006 | Egawa et al. ............... | 438/106 |
| 2005/0017336 | A1 * | 1/2005 | Kung et al. .................. | 257/685 |

OTHER PUBLICATIONS

Robert Drost et al., "Electronic Alignment for Proximity Communication," 2004 IEEE International Solid-State Circuits Conference, Feb. 17, 2004.

(Continued)

*Primary Examiner*—Thao X Le
(74) *Attorney, Agent, or Firm*—Ingrassia, Fisher & Lorenz, P.C.

(57) ABSTRACT

Multi-chip semiconductor device assemblies and methods for fabricating such assemblies are provided. An exemplary assembly comprises a first chip having a first surface and comprising a plurality of conductive pads disposed at the first surface and a plurality of circuits. Each of the pads is electrically coupled to one of the circuits. A second chip having a second surface is disposed adjacent to the first surface of the first chip. The second chip comprises a plurality of bonding members disposed at the second surface. Each of the bonding members is connected to a corresponding pad. The second chip is electrically coupled to at least one of the circuits via a corresponding pad and a corresponding bonding member. The second chip comprises a first and a second portion. The first portion overlies at least a portion of the first chip and the second portion extends beyond the first chip.

12 Claims, 4 Drawing Sheets

OTHER PUBLICATIONS

Daisuke Mizoguchi et al., A 1.2Gb/s/pin Wireless Superconnect Based on Inductive Inter-Chip Signaling (IIS), 2004 IEEE International Solid-State Circuits Conference, Feb. 17, 2004.

Eric Beyne, "3D Interconnection and Packaging: Impending Reality or Still a Dream?" 2004 IEEE International Solid-State Circuits Conference, Feb. 17, 2004.

Takayuki Ezaki et al., "A 160Gb/s Interface Design Configuration for Multichip LSI," 2004 IEEE International Solid-State Circuits Conference, Feb. 17, 2004.

Semtech Corp., "Flip Chip TVS Evaluation and Assembly Guide," SI00-06 Surging Ideas TVS Diode Application Note, Revised Nov. 2001.

John Davis et al., "Improving the Acceptance of Flip Chip," Circuits Assembly, Apr. 2004.

"3M No-Flow Underfill," Technical Data Sheet, 3M Industrial Business Electronics Markets Materials Division, 2003.

Steve Greathouse, "3D Stacked Package Technology," PowerPoint Presentation, Intel Corporation, Jul. 15, 2003.

Hannes Kostner et al., "New Flip-Chip on Chip Process Supercedes Embedded Technologies," 14th European Microelectronics and Packaging Conference & Exhibition, Friedrichshafen, Germany, Jun. 23-25, 2003, pp. 1-6.

* cited by examiner

MULTI-CHIPS SEMICONDUCTOR DEVICE ASSEMBLIES AND METHODS FOR FABRICATING THE SAME

FIELD OF THE INVENTION

The present invention generally relates to semiconductor device packaging, and more particularly relates to three-dimensional ("3D"), stacked multi-chips flip-chip packaging and methods for fabricating 3D, stacked multi-chip flip-chip packages.

BACKGROUND OF THE INVENTION 3D die packaging and die packaging containing multiple chips ("multi-chips") has continued to receive a significant amount of attention from designers and manufacturers of electronic products. Industrial and consumer electronic products tend toward smaller size, lower cost, greater efficiency, and increased functionality. These trends place greater emphasis on the development of semiconductor packaging technologies which can accommodate denser, more complex integrated circuits in smaller packages. 3D packaging and multi-chips packaging have responded to these trends by inserting two or more silicon chips inside one package to increase functionality of the package and to achieve a "system in a package."

Flip-chip technology is a well-developed semiconductor fabrication technology that allows the overall semiconductor package size to be made very compact by "stacking" semiconductor devices or chips. The flip-chip package configuration differs from conventional packaging configurations particularly in that it includes the mounting of a first semiconductor chip in an upside-down manner over a second substrate and electrically couples the first chip to the second substrate by means of solder bumps provided on the active surface of the first chip. Since minimal or no bonding wires are required, which would otherwise occupy additional layout space, the overall size of the flip-chip package can be made compact as compared to wirebonded types of electronic packages.

However, current methods for stacking chips pose considerable difficulties in terms of integration, manufacturing and electrical testing. In particular, current methods for 3D packaging typically include the stacking of first chips onto a wafer of multiple second chips. After wafer assembly, the stacked chips are singulated by sawing the wafer between chips. However, to prevent sawing of the overlying chips, or to prevent cracking or chipping of the overlying chips during sawing, the overlying first chips are made smaller than the underlying second chips. This necessarily restricts the dimensions of first chips that can be stacked for three-dimensional silicon integration, thus limiting the integration of the semiconductor package. Increasing the size of the underlying chip usually is not a viable solution because it is costly. Furthermore, large silicon chips experience higher stresses than small silicon chips.

Another chip stacking method includes the stacking of three or more chips on top of each other and then wirebonding the chips from different heights down to common package leads to connect the multiple chips together inside a package. However, this method poses additional drawbacks. The layout of the wirebond pads must be predetermined and oriented to prevent wires from crossing and shorting. The chips also must be thinned to fit wirebond loops within the package. In addition, stacked chips requiring wirebonds to every chip limit the extension of top chips beyond the edge of bottom chips. Moreover, thermal-compression forces onto thinned chips require a stable silicon platform that does not bend excessively during wirebonding.

In addition, present day stacking methods may pose operational problems. In other words, operation of one die in a die stack may interfere with the operation of an adjacent die in the stack. For example, a portion of an overlying or underlying chip may comprise inductive or capacitive circuits that emit high electric and/or magnetic fields. These high intensity fields may cross-couple with neighboring chips and adversely effect the operation of an adjacent chip in the stack, thus adversely affecting the operation of the semiconductor package as a whole.

Further, testing of stacked chips has proven difficult. Typically, it is necessary to test each chip in a stack separately, which involves time-intensive and often costly effort. In addition, it is often difficult to test the stack until it has already been wire-bonded and packaging has been completed. Accordingly, without the ability to test the chips before packaging, silicon chips may be blindly packaged, with yield fall-out occurring after packaging, not before packaging, as is preferred.

Accordingly, it is desirable to provide multiple-chip semiconductor device assemblies with increased functionality. In addition, it is desirable to provide multiple-chip semiconductor device assemblies in which the operation of one chip in the stack does not adversely affect the operation of another chip in the stack. It is further desirable to provide multiple-chip semiconductor device assemblies that permit accurate and efficient testing of the assemblies before packaging. It is also desirable to provide methods for fabricating such multiple-chip semiconductor device assemblies. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

Skilled artisans will appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
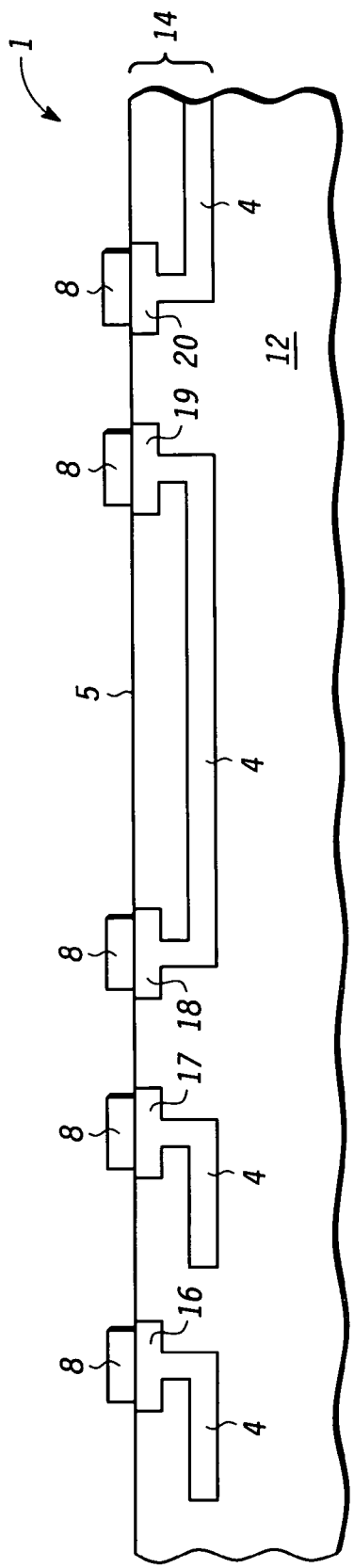
FIG. 1 is a cross-sectional view of a semiconductor device having bonding pads overlying a substrate, in accordance with one exemplary embodiment of the present invention.

FIGS. 1-7 illustrate a method for fabricating a multiple-chips semiconductor device assembly in accordance with an exemplary embodiment of the present invention. Referring to FIG. 1, a first semiconductor device or chip 1 comprises a portion of an integrated circuit (IC) wafer 12. Integrated circuit wafer 12 has an interconnect region 14 which includes a plurality of metal layers for routing power, ground, signals, and other lines between various components of first semiconductor device 1 within IC wafer 12. As illustrated in FIG. 1, interconnect region 14 may include one or more final metal layers 4 with exposed metal portions 16, 17, 18, 19, and 20, which may also be referred to as contacts 16, 17, 18, 19, and 20. Contacts 16, 17, 18, 19, and 20 are positioned at a surface 5 of IC wafer 12. The metal layers 4 of interconnect region 14 may be interconnected between each other using vias, as illustrated in FIG. 1, or any other suitable contact structure. In one embodiment, the metal layers 4 of interconnect region 14 are formed from conductive materials, such as, for example, aluminum, copper, or gold. In other embodiments, there may be more or less metal layers. In the illustrated embodiment, the metal layers 4 of interconnect region 14, including contacts 16, 17, 18, 19, and 20, are formed of aluminum.

IC wafer 12 of first semiconductor device 1 is subjected to conventional fabrication techniques for forming electrical circuits (not shown) in the active regions or substrate of IC wafer 12. The electrical circuits may be for various integrated circuit applications, such as for example, communications, transportation, general computation, and the like. Electrical connections are provided to and from the electrical circuitry via the metal layers 4 of interconnect region 14, as discussed above. The substrate of IC wafer 12 may be any type of substrate, such as, for example, a silicon substrate, a silicon germanium substrate, a gallium arsenide substrate, a silicon-on-insulator substrate, an insulating glass substrate, a sapphire substrate, or any other type of suitable substrate.

In the illustrated embodiment, after the final metal layers 4 of interconnect region 14 are formed, a plurality of conductive landing pads 8 are formed for subsequent mounting of a second overlying chip onto first semiconductor device 1, as described in more detail below. The landing pads 8 can be either SMD (Solder Mask Define) type, NSMD (Non-SMD) type, mixed SMD-NSMD type, or any other conventional landing pads used in flip-chip package technology and/or chip scale package technology. These types of landing pads are all well known in the semiconductor industry, so description thereof will not be further detailed.

Figure 2:
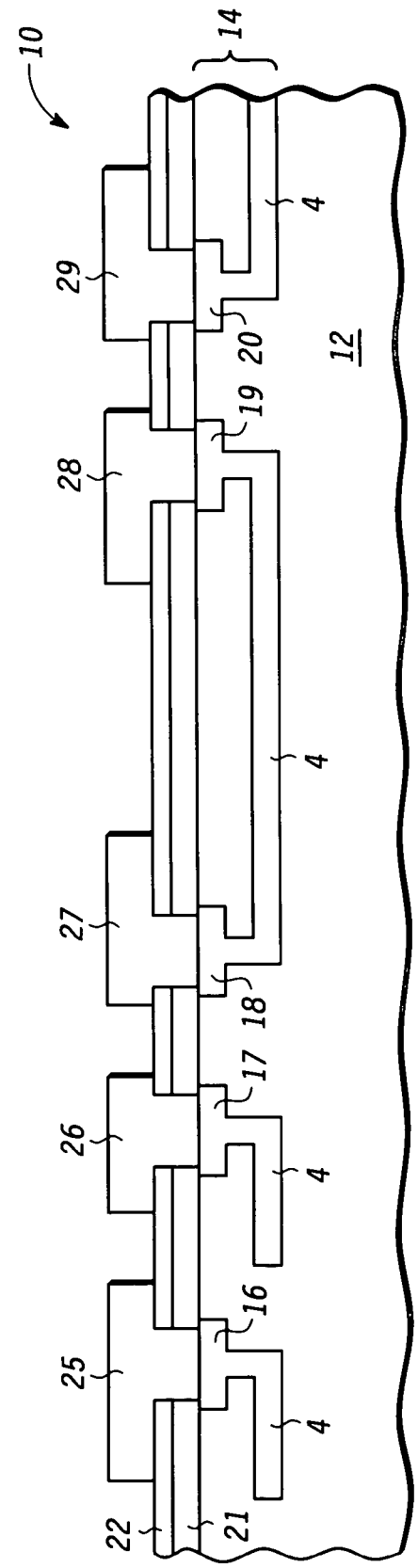
FIG. 2 is a cross-sectional view of a semiconductor device having a passivation layer overlying a substrate, an organic layer overlying the passivation layer, and a robust metal layer overlying at least portions of the passivation layer, in accordance with another exemplary embodiment of the present invention.
Figure 3:
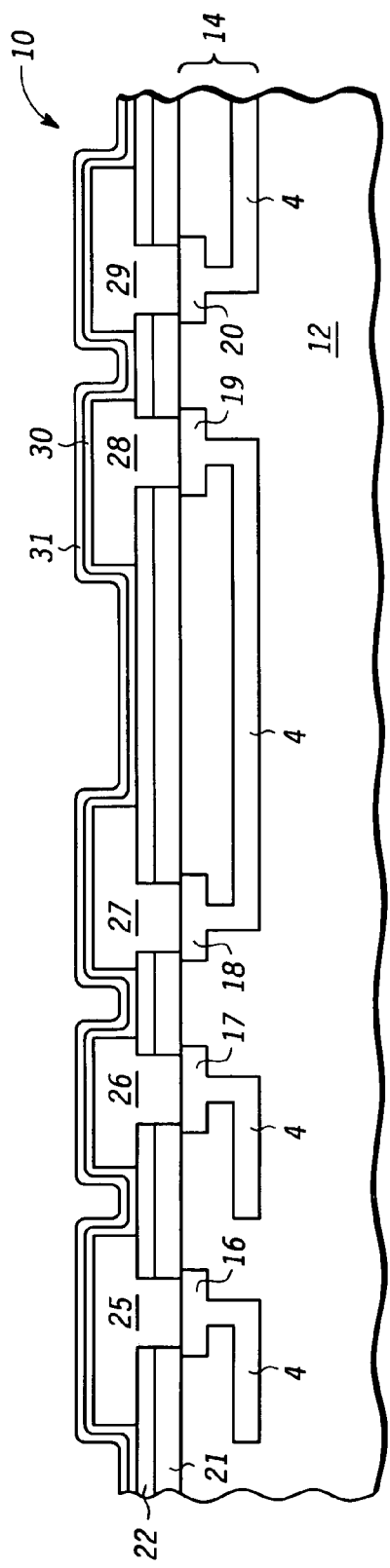
FIG. 3 is a cross-sectional view of the semiconductor device of FIG. 2 after formation of a sputterable nonwettable refractory metal overlying the passivation layer and of a metal layer overlying the nonwettable refractory metal in accordance with an exemplary embodiment of the present invention.

Referring to FIGS. 2 and 3, in another, preferred, exemplary embodiment of the invention, semiconductor device 1 may be a semiconductor device 10 in which robust metal portions 25, 26, 27, 28, and 29 serve as landing pads 8. In this embodiment, after the final metal layers 4 of interconnect region 14 are formed, a passivation layer 21 may be formed over the top surface of semiconductor device 10. In one embodiment, passivation layer 21 includes an oxynitride, such as a plasma oxynitride, and may be formed using conventional processes. An organic layer 22 may be formed overlying passivation layer 22. In one embodiment, organic layer 22 is a polyimide layer; however in an alternate embodiment, organic layer 22 may not be present at all. Openings are formed in passivation layer 21 and organic layer 22, if present, to expose metal portions or contacts 16, 17, 18, 19, and 20 to allow for electrical coupling, such as between semiconductor device 10 and another device.

Still referring to FIG. 2, a robust metal layer having robust metal portions 25, 26, 27, 28, and 29 is formed. In one embodiment, a metal seed layer is formed overlying organic layer 22 and patterned such that a portion of the metal seed layer contacts each of exposed metal portions 16, 17, 18, 19, and 20 of IC wafer 12. A metal may then be electroplated onto the seed layer to form robust metal portions 25, 26, 27, 28, and 29 of the robust metal layer. Therefore, each robust metal portion 25, 26, 27, 28, and 29 provides an electrical connection to exposed metal portions (or contacts) 16, 17, 18, 19, and 20, respectively, which, as discussed above, provide electrical connections to the electrical circuits within IC wafer 12. As will be discussed below, robust metal portions 25, 26, 27, 28, and 29 form strong metallurgical bonds with solder bumps of a second semiconductor device. It will be appreciated that, in one embodiment of the invention, semiconductor device 10 may comprise one or more additional contacts (not shown), which do not have a robust metal portion, a passivation layer, or an organic layer deposited thereon. These exposed metal contacts may function as probe and wire bond pads, which are well-known in the semiconductor arts.

In one embodiment, the robust metal layer is a power metal layer, such as, for example, a power copper layer, which is used to route and supply power, ground or signals to the electrical circuits within IC wafer 12. In this embodiment, the robust metal layer may be formed sufficiently thick to be capable of carrying large currents for discrete periods of time. For example, in one embodiment, a power copper layer is sufficiently thick to carry at least 15 Amps of current, or at least 20 Amps of current, or even larger currents for discrete periods of time. The robust metal layer may be formed using various conductive metals, such as, for example, copper or gold. In one embodiment, the robust metal layer is sufficiently thick to sustain probing with probe needles without damage. That is, even after probing, robust metal portions 25, 26, 27, 28, and 29 are still in good enough condition to be used as landing pads, as will be described in more detail below. Also, sufficient thickness of the robust metal layer may be used to prevent complete consumption of the robust metal layer by solder. (In one embodiment, the robust metal layer is thick enough to survive corrosive effects during the lifespan of products.) Therefore, in one embodiment, robust metal layer is at least 4 microns thick. Alternatively, robust metal layer may be targeted to be within a range of approximately 8 to 16 microns, or, alternatively, approximately 8+/−4 microns to 16+/−4 microns. Therefore, depending on the design of semiconductor device 10, the thickness of robust metal layer may be sufficient to sustain probing or to carry larger currents or both.

Referring to FIG. 2, note that robust metal portions 26 and 28 are formed mainly over exposed metal portions 17 and 19, respectively, while metal portions 25, 27, and 29 are formed over exposed metal portions 16, 18, and 20 and laterally extend further to the right or left of exposed metal portion 16, 18, and 20 over organic layer 22 as compared to robust metal portions 26 and 28. Therefore, robust metal layer portions may be formed in a variety of different ways to provide electrical connections to the final metal layer of IC wafer 12. This ability to spatially redistribute the robust metal portions of the robust metal layer may, in one embodiment, be used to allow for improved alignment when, for example, a second device is coupled to semiconductor device 10. (This ability may also allow for improved mechanical robustness, as described below.)

FIG. 3 illustrates semiconductor device 10 after formation of a nonwettable refractory metal layer 30 overlying organic layer 22 and robust metal portions 25, 26, 27, 28, and 29, and a metal layer 31 overlying nonwettable refractory metal layer 30. In one embodiment, nonwettable refractory metal layer 30 is sputtered onto IC wafer 12, over organic layer 22 (or passivation layer 21 if organic layer 22 is not present) and robust metal portions 25, 26, 27, 28, and 29, and metal layer 31 is sputtered onto IC wafer 12 over nonwettable refractory metal layer 30. In one embodiment, metal layer 31 is a thin copper layer used to promote adhesion of photoresist (as will be described below in reference to FIG. 4). In one embodiment, metal layer 31 is less than 500 nm. (Alternatively, other materials may be used for metal layer 31, additional layers may be used, or metal layer 31 may not be present.) In one embodiment, the sputterable nonwettable refractory metal 30 is titanium tungsten (TiW). For example, TiW may be used over the robust metal layer portions when they are formed of copper since it is harder and more oxidation resistant than copper. That is, the oxide that forms on TiW is typically thin and easily scratched through during probing. However, in alternate embodiments, other sputterable nonwettable refractory metals may be used, such as, for example, titanium-containing metals (e.g. titanium nitride (TiN), titanium tungsten nitride (TiWN)), aluminum-containing metals, tungsten-containing metals, chromium-containing metals, etc.

Nonwettable refractory metal layer 30 may also be referred to as a solder mask layer since this nonwettable (i.e. non-solderable) metal will be used as a solder mask for the landing pads formed from metal portions 25, 26, 27, 28, and 29, as will be described in reference to subsequent figures below. Where nonwettable refractory metal layer 30 does not cover the robust metal portions, solder from solder bumps of a second device, discussed below, can wet the robust metal portions. In one embodiment, nonwettable refractory metal layer 30 is thin, for example, less than 350 nm. Therefore, in one embodiment, the ability to sputter the nonwettable refractory metal layer allows for a thin solder mask layer. Note that since semiconductor device 10 may be one device within a wafer of devices (such as IC wafer 12), the pitch of electrical connections to robust metal portions 25, 26, 27, 28, and 29 is small, e.g. about 30 microns. Therefore, a sufficiently thin solder mask layer which allows for the finer pitch may be needed, which, in one embodiment, may be accomplished by thin film sputtering.

Note that in one embodiment, the same metal seed layer employed under the robust metal layer is reused as a solder mask over the same robust metal layer. (For example, the metal seed layer and solder mask layer may both be copper/TiW.) Having the same sputtered on metal process serving both as metal seed and as solder mask simplifies manufacturing. Also, refractory metal is generally both hard and electrically conductive. Therefore, in one embodiment, probing on the solder mask (e.g. nonwettable refractory metal layer 30) is generally superior to probing directly on a robust metal layer formed of copper which is generally softer and naturally forms thick oxide layer that hinders probing after extended exposure to an oxidizing atmosphere.

Figure 4:
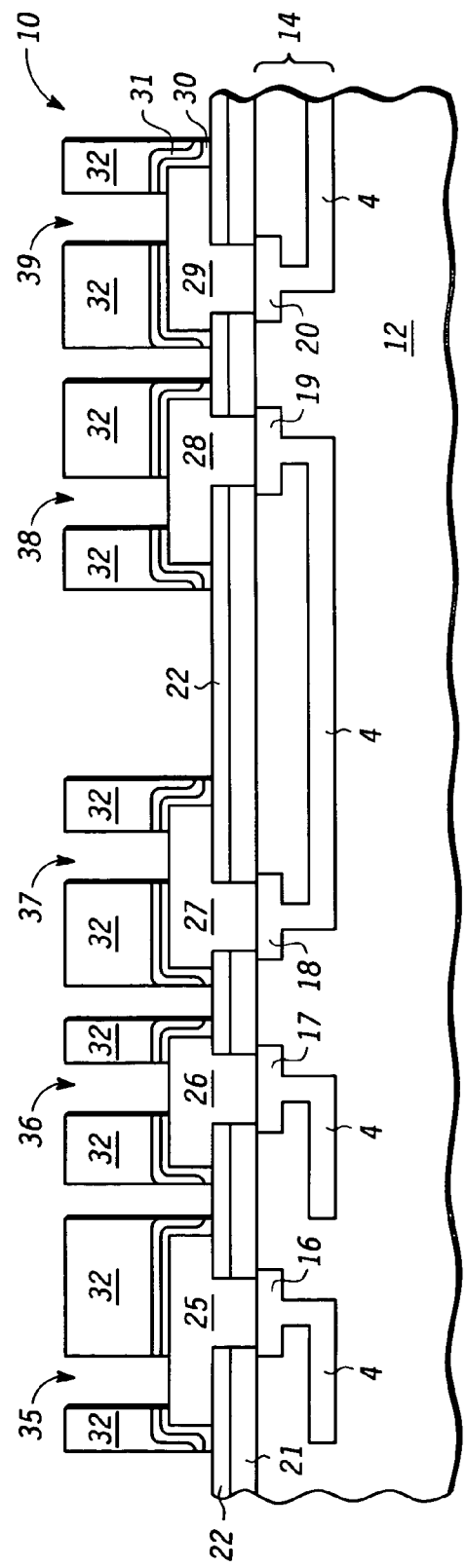
FIG. 4 is a cross-sectional view of the semiconductor device of FIG. 3 having a patterned masking layer and etched metal layers in accordance with an exemplary embodiment of the present invention.

FIG. 4 illustrates semiconductor device 10 after formation of a patterned masking layer 32 and landing pads 35, 36, 37, 38, and 39. A masking layer 32 is formed overlying metal layer 31 and is patterned. In one embodiment, metal layer 31 is an adhesion layer which promotes adhesion of masking layer 32, which may, for example, be a photoresist layer. The exposed portions of nonwettable refractory metal layer 30 and metal layer 31 may then be removed or etched to expose underlying portions of the robust metal layer (to form landing pads 35, 36, 37, 38, and 39) and organic layer 22 (to electrically isolated landing pads 35, 36, 37, 38, and 39 from each other). In one embodiment, masking layer 32 is formed and patterned using conventional processes. In the illustrated embodiment, masking layer 32 is patterned to expose portions of robust metal portions 25, 26, 27, 28, and 29, and to electrically isolate robust metal portions 25, 26, 27, 28, and 29 from each other.

Figure 5:
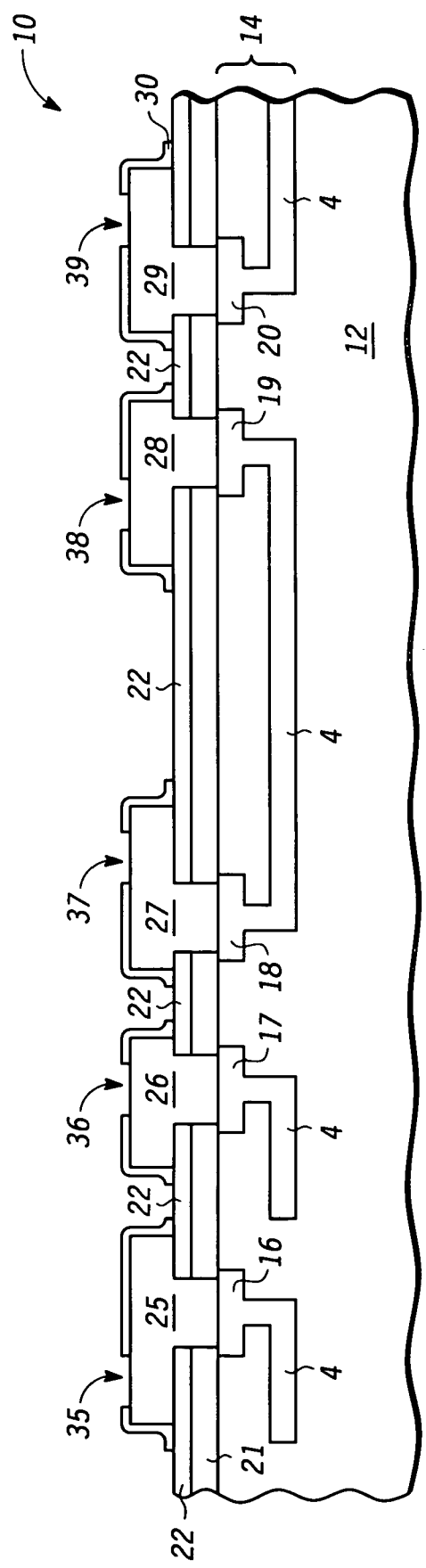
FIG. 5 is a cross-sectional view of the semiconductor device of FIG. 4 after removal of the patterned masking layer.

FIG. 5 illustrates semiconductor device 10 after removal of patterned masking layer 32. In the illustrated embodiment, a cleaning of robust metal portions 25, 26, 27, 28, and 29 may be performed after removal of pattern masking layer 32, which removes metal layer 31, too. For example, in one embodiment, a copper clean is used which includes an oxygen plasma ash and a dilute sulfuric dip. Also, a microetch may be performed to reclean landing pads 35, 36, 37, 38, and 39 before further assembly. Therefore, as described above, semiconductor device 10 includes landing pads 35, 36, 37, 38, and 39 formed directly from robust metal portions 25, 26, 27, 28, and 29, respectively. Note that in one embodiment, no additional layer is needed over landing pads 35, 36, 37, 38, and 39 to electrically connect to another device.

Therefore, it can now be seen how, in one embodiment, a robust metal layer, such as, for example, a power copper layer, may be used to form landing pads which provide electrical connections to a second device. Also note that in one embodiment, the robust metal portions may be used as test probe pads on semiconductor device 10 in order to test a second, overlying semiconductor device, described in more detail below, separately if needed.

As described above, robust metal portions 25, 27, and 29 are spatially redistributed such that landing pads 35, 37, and 39 are not aligned with metal portions 16, 18, and 20, respectively, unlike landing pads 36 and 38 which are generally aligned with metal portions 17 and 19, respectively. This redistribution attribute of the robust metal layer allows for connectivity with a second, overlying device. For example, without spatial redistribution of robust metal portions 25, 27, and 29, landing pads corresponding to metal portions 16, 18, and 20 may not be aligned to receive a solder ball of the second, overlying device. Therefore, the robust metal layer may be formed as needed to provide appropriate landing pads for subsequent coupling to a second device. Also, the spatial redistribution may allow for an improved mechanical connection. For example, referring to FIG. 5, because organic layer 22 (which may be, for example, a polyimide layer) provides for a softer cushion, robust metal portions 25, 27 and 29 may be more robust than robust metal portions 26 and 28 because robust metal portions, 25, 27, and 29 have more of a cushion beneath them (i.e. robust metal portions 25, 27, and 29 have a larger area of underlying organic layer 22 as compared to robust metal portions 26 and 28). Accordingly, any impact stresses and stresses caused by differences in coefficients of thermal expansion are less likely to damage sensitive semiconductor devices underlying robust metal portions 25, 27, and 29 and metal layers of interconnect region 14. A landing pad may be positioned directly over a metal portion, rather than spatially redistributed; however, such design maybe weaker as impact stress during flip-chip assembly (discussed below) may be more likely to damage active devices under the landing pads. Therefore, in one preferred embodiment, a majority or all of the robust metal portions includes spatially redistributed metal portions, such as robust metal portions 25, 27, and 29, over organic layer 22.

The thickness of the robust metal layer, as discussed above, may be selected so that the robust metal layer can carry sufficient current without overheating, electromigration, or other side effects. The thickness may also be selected to withstand corrosion effects. In one embodiment, the thickness of the robust metal layer is selected to withstand impact damage. Types of impact damage include, for example, probing impact damage and flip-chip assembly impact damage. Therefore, the thickness of the robust metal layer may be selected so as to aid in preventing such assembly damage. Thus, the thickness of the robust metal layer may be selected for a variety of reasons, as described above, or for any combination of those or other reasons. Also, placing the robust metal layer over a cushion of polyimide (such as, for example, organic layer 22) may minimize the damaging effect of thick robust metal film stress and also flip-chip impact damage during high-speed assemblies.

Figure 6:
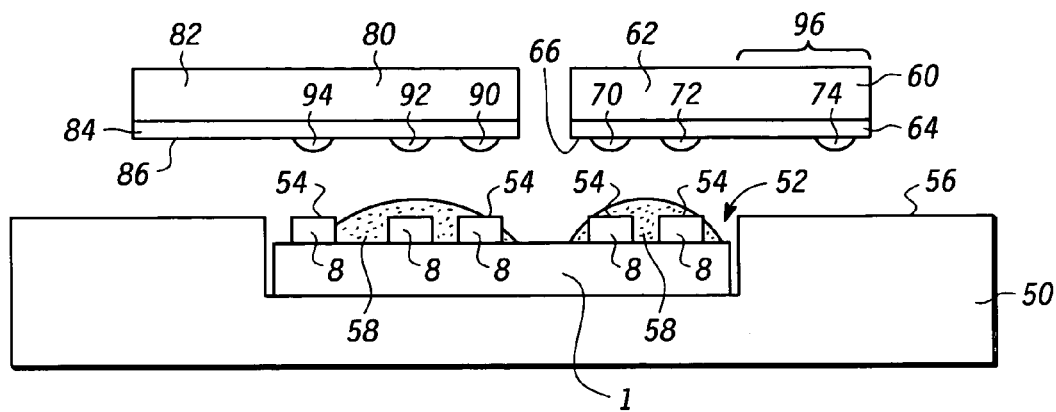
FIG. 6 is a cross-sectional view of the semiconductor device of FIG. 1 disposed within a carrier and having two semiconductor devices positioned to be coupled to the semiconductor device in accordance with an exemplary embodiment of the present invention.

Turning now to FIG. 6, after formation of semiconductor device 1, which preferably comprises semiconductor device 10 of FIG. 5, wafer 12 may be probed, thinned, and/or cleaned and subjected to any other suitable fabrication process. Then, wafer 12 may be sawed or otherwise diced into individual chips comprising one or more of semiconductor device 1. Semiconductor device 1 then may be disposed within a cavity 52 of a carrier 50. While carrier 50 is illustrated in FIG. 6 with only one cavity 52, it will be appreciated that carrier 50 may have tens, hundreds, or thousands of cavities 52, each configured to receive a semiconductor device, such as semiconductor device 1, or semiconductor device 10. Preferably, the lateral dimensions of cavity 52 are substantially equal to the lateral dimensions of semiconductor device 1 so that semiconductor device 1 may be received within cavity 52 but may be restricted from significant movement within cavity 52 during subsequent package assembly. Also in a preferred embodiment of the invention, the vertical dimension of cavity 52 is substantially equal to the height of semiconductor device 1 so that a top surface 54 of landing pads 8 and a top surface 56 of carrier 50 lie in substantially the same horizontal plane. Carrier 50 may comprise any suitable material or materials, such as, for example, aluminum or any suitable metal. Preferably, however, carrier 50 comprises a non-wettable, high-temperature material or a non-wettable, high-temperature coating, such as graphite or anodized aluminum, to prevent between-chip solder material, discussed in more detail below, from adhering to carrier 50 during a subsequent reflow process.

After insertion of semiconductor device 1 in cavity 52, one or more drops or spots of a suitable no-flow underfill material 58 may be dispensed on semiconductor device 1. No-flow underfill material is known in the semiconductor art and typically comprises a combination of underfill materials and flux agents that permits a reflow process, to be discussed in more detail below, to be performed at the same time that the curing of the underfill material is conducted. An example of a no-flow underfill material suitable for use in the exemplary embodiment of the present invention is No-Flow Underfill UF3667 available from 3M of St. Paul, Minn., although any other suitable no-flow underfill that is compatible with the solder bumps, to be discussed below, also may be used. In another embodiment of the invention, the no-flow underfill material 58 may be dispensed on semiconductor device 1 before semiconductor device 1 is disposed in cavity 52.

A second semiconductor device 60 may be positioned over semiconductor device 1. Second semiconductor device 60 comprises a device substrate 62 having functional circuitry 64 formed at a first surface 66 of second semiconductor device 60. Second semiconductor device 60 may be any kind of device (or chip) such as, for example, an integrated circuit, die, a microelectro-mechanical system (MEMS) device, a compound semiconductor device, a memory device, a discrete power device, integrated passives, an opto device, etc. Therefore, functional circuitry 64 may include any type of circuitry to perform a variety of different functions.

Between-chip solder material, such as a plurality of solder balls 70, 72, and 74, may be formed on first surface 66 of second semiconductor device 60 to provide electrical connections to functional circuitry 64. For example, as known in the art, solder balls 70 and 72, may provide electrical connections via under-bump metallurgy and an interconnect region (similar, for example, to interconnect region 14 of IC wafer 12) to the electrical component or components within functional circuitry 64. Therefore, in one embodiment, solder balls 70, 72, and 74 may be formed using conventional processes. In one embodiment, the solder balls are high temperature solder balls such as lead-free tin-copper solder balls, or tin-copper-silver solder balls. In one embodiment (not shown), the solder balls may include a copper stud or standoff. In an alternate embodiment, solder balls 70, 72, and 74 may be formed on landing pads similar to landing pads 35, 36, 37, 38, and 39 of FIG. 5. That is, in one embodiment, second semiconductor device 60 may have solder balls 70, 72 and 74 formed on a robust metal layer, as was described above in reference to semiconductor device 10.

In one embodiment, the between-chip solder material (e.g. solder balls 70, 72, and 74) may be formed of a material that is selected to have a high melting point. The high melting point may be selected to be not substantially less than an expected peak of temperature reflow during package mounting on boards. For example, the solder material may be selected to have a melting point within 20 degrees Celsius of a package reflow temperature. In one embodiment, the package mounting peak reflow point is 230 degrees Celsius, and the between-chip solder material is selected to have a melting point of at least 210 degrees Celsius. The solder material is typically lead free rather than eutectic tin-lead. Although eutectic tin-lead can be used, it may not be as desirable because sustained heat during after-packaging board assembly may remelt the solder material.

Still referring to FIG. 6, second semiconductor device 60 then is aligned over semiconductor device 1 so that solder balls 70 and 72 substantially align with and contact a first set of landing pads 8 of semiconductor device 1. In one embodiment, a pick and place tool may be used to align and place second semiconductor device 60 onto semiconductor device 1 of wafer 12. Solder ball 74 may be disposed on surface 66 of second semiconductor device 60 so that it overlies surface 56 of carrier 50 when second semiconductor device 60 contacts semiconductor device 1. In this regard, solder ball 74 stabilizes second semiconductor device 60 to maintain second semiconductor device 60 in a substantially horizontal position so that solder balls 70 and 72 substantially evenly contact landing pads 8. In addition, solder ball 74 may serve to protect the circuitry 66 of semiconductor device 60. Thus, in one embodiment of the invention, solder ball 74 may be disposed on surface 66 of second semiconductor device 60 such that it is not electrically connected to functional circuitry of second semiconductor device 60.

In another embodiment of the invention, a third semiconductor device 80 may be positioned over semiconductor device 1. Third semiconductor device 80 comprises a device substrate 82 having functional circuitry 84 formed at a first surface 86 of third semiconductor device 80. Similar to second semiconductor device 60, third semiconductor device 80 may be any kind of device (or chip) such as, for example, an integrated circuit, die, a microelectro-mechanical system (MEMS) device, a compound semiconductor device, a memory device, a discrete power device, integrated passives, opto device, etc. Therefore, functional circuitry 84 may include any type of circuitry to perform a variety of different functions.

A plurality of solder balls 90, 92, and 94 are formed on first surface 86 of third semiconductor device 80 to provide electrical connections to functional circuitry 84. For example, as known in the art, solder balls 90, 92, and 94 may provide electrical connections via under bump-metallurgy and an interconnect region (similar, for example, to interconnect region 14 of IC wafer 12) to the electrical component or components within functional circuitry 84. Therefore, in one embodiment, solder balls 90, 92, and 94 may be formed using the same or similar conventional processes used to form solder balls 70, 72, and 74. In one embodiment, the solder balls are high temperature solder balls, such as lead-free tin-copper solder balls, or tin-copper-silver solder balls. Preferably, solder balls 90, 92, and 94 are formed of the same material as solder balls 70, 72, and 74 of semiconductor device 60 so that a one pass reflow process, discussed below, may be used. In one embodiment (not shown), the solder balls may include a copper stud or standoff. In an alternate embodiment, 5solder balls 90, 92, and 94 may be formed on landing pads similar to landing pads 35, 36, 37, 38, and/or 39 of FIG. 5. That is, in one embodiment, third semiconductor device 80 may have solder balls 90, 92 and 94 formed on a robust metal layer, as was described above in reference to semiconductor device 10.

Third semiconductor device 80 then may be aligned over semiconductor device 1 so that solder balls 90, 92, and 94 are substantially aligned with a second set of landing pads 8 of semiconductor device 1. It will be appreciated that third semiconductor device 80 does not comprise a solder ball, such as solder ball 74 described above with reference to second semiconductor device 60, that is disposed on surface 86 of third semiconductor device 80 so that it overlies surface 56 of carrier 50 when third semiconductor device 80 is placed on semiconductor device 1. Thus, in one exemplary embodiment of the invention, third semiconductor device 80 may be of a sufficient size and/or may overlie a sufficient portion of semiconductor device 1 such that a stabilizing solder ball, such as solder ball 74, is optional for stabilizing third semiconductor device 80 during bonding.

As will be appreciated from FIG. 6 and the above description, one or both of second semiconductor device 60 and third semiconductor device 80 may be placed on semiconductor device 1. Further, if dimensions permit, a fourth semiconductor device and any additional semiconductor devices may be placed on semiconductor device 1. In addition, in one embodiment of the invention, the entirety of second semiconductor device 60 and/or third semiconductor device 80 may overlie semiconductor device 1. Alternatively, it will be appreciated that second semiconductor device 60 and/or third semiconductor device 80 may comprise two portions, a first portion that overlies semiconductor device 1 and a second portion that overlies carrier 50. In this manner, if the overlying semiconductor device comprises inductive or capacitive circuitry that may emit higher electric and/or magnetic fields that otherwise may adversely affect the operation of semiconductor device 1, the overlying semiconductor device may be designed and/or placed on semiconductor device 1 so that the portion of the semiconductor device comprising the circuitry emitting electric and/or magnetic fields extends beyond semiconductor device 1 so as not to overlie semiconductor device 1. Likewise, if the semiconductor device 1 comprises inductive or capacitive circuitry that may emit electric and/or magnetic fields that otherwise may adversely affect the operation of the overlying semiconductor device, the overlying semiconductor device may be placed on semiconductor device 1 so that the portion of semiconductor device 1 comprising the circuitry does not underlie the overlying semiconductor device.

Figure 7:
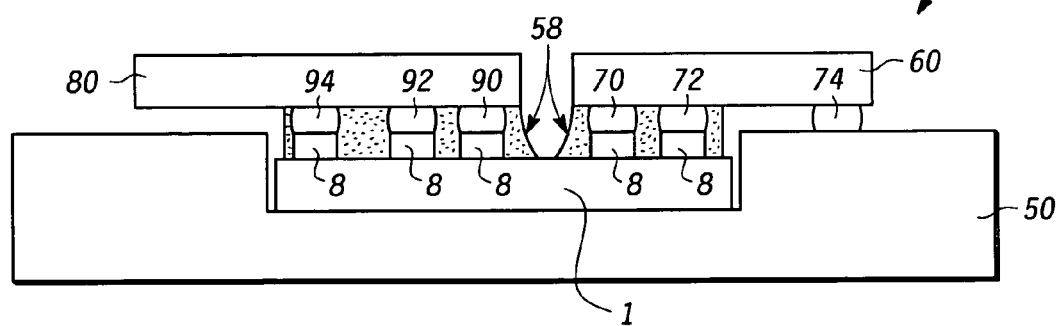
FIG. 7 is a cross-sectional view of the semiconductor device and the two overlying semiconductor devices of FIG. 6 after attachment and reflow, in accordance with an exemplary embodiment of the present invention.

Referring now to FIG. 7, carrier 50 then may be placed in a furnace for reflow of the between-chip solder material (e.g., solder balls 70, 72, 90, 92, and 94) and for curing of no-flow underfill material 58. The temperature of the furnace may be any suitable temperature for both solder wetting reflow and curing and, as will be appreciated, may be determined by the composition of the between-chip solder material and/or the no-flow underfill material 58. Accordingly, by using a no-flow underfill material as described above, reflow and underfill curing can be performed at one reflow step, thus minimizing process steps.

It will be appreciated, however, that in another exemplary embodiment of the invention, rather than utilizing a no-flow underfill material, a conventional underfill material may be used. In this regard, underfill is not dispensed on semiconductor device 1 prior to reflow but, rather, after reflow. Before placement of semiconductor devices 60 and 80, the solder balls of semiconductor devices 60 and 80 are dipped in a flux paste so that each solder ball includes some flux on its tips. The flux paste may be selected based on the solder used for the solder balls. Furthermore, the flux paste may be a no-clean flux paste that is sufficiently tacky such that a portion of the flux remains on the solder balls when dipped into the paste. After placement of the overlying semiconductor devices, carrier 50 then may be placed in a furnace for reflow. After reflow, an underfill material then may be dispensed by syringe on semiconductor device 1 next to second semiconductor device 60 and/or third semiconductor device 80. Carrier 50 then may be placed in a furnace to cause the underfill material to fill the space between the overlying semiconductor device(s) and semiconductor device 1 and to cure. In yet another embodiment of the invention, no underfill is used, thus reducing cost where mechanical reliability is not required. Accordingly, molding compound injected during overmolding of packages would fill the space between the semiconductor devices.

Accordingly, as will be appreciated, when a conventional underfill is used, space between second semiconductor device 60 and third semiconductor device 80 preferably is maintained so that a syringe or other dispensing device may dispense underfill to the surface of semiconductor device 1. The space between second semiconductor device 60 and third semiconductor device 80 preferably is sufficiently wide to allow capillary ingress of conventional underfill and associated filler particles. Application of conventional underfill affects both solder ball height and solder ball pitch, as is well known. In contrast, by utilizing no-flow underfill material 58, which is dispensed before second semiconductor device 60 and/or third semiconductor device 80 is placed on semiconductor device 1, second semiconductor device 60 may be disposed substantially directly adjacent third semiconductor device 80 with minimal space between the two overlying semiconductor devices. In addition, as no-flow underfill material 58 does not substantially flow during curing, no-flow underfill material is less likely than conventional underfill material to flow over wire bond pads formed on semiconductor device 1. As illustrated in FIG. 7, after curing, no-flow underfill material 58, or conventional underfill if so used, facilitates the connection of second semiconductor device 60 and third semiconductor device 80 to semiconductor device 1 and provides stability therebetween.

A resulting multi-chip semiconductor device assembly 100, now comprising semiconductor device 1, second semiconductor device 60, and/or third semiconductor device 80 then may be removed from carrier 50 and packaged using conventional methods. Assembly 100 may be probed to determine functionality of the devices 1, 60, and/or 80 before packaging. Additional robust metal portions, discussed above, may be utilized to facilitate probing. Laser trimming, which is well known in the semiconductor industry, also may be performed to adjust circuit performance. Any assembly 100 which does not meet probing test criteria may be rejected prior to packaging.

Figure 8:
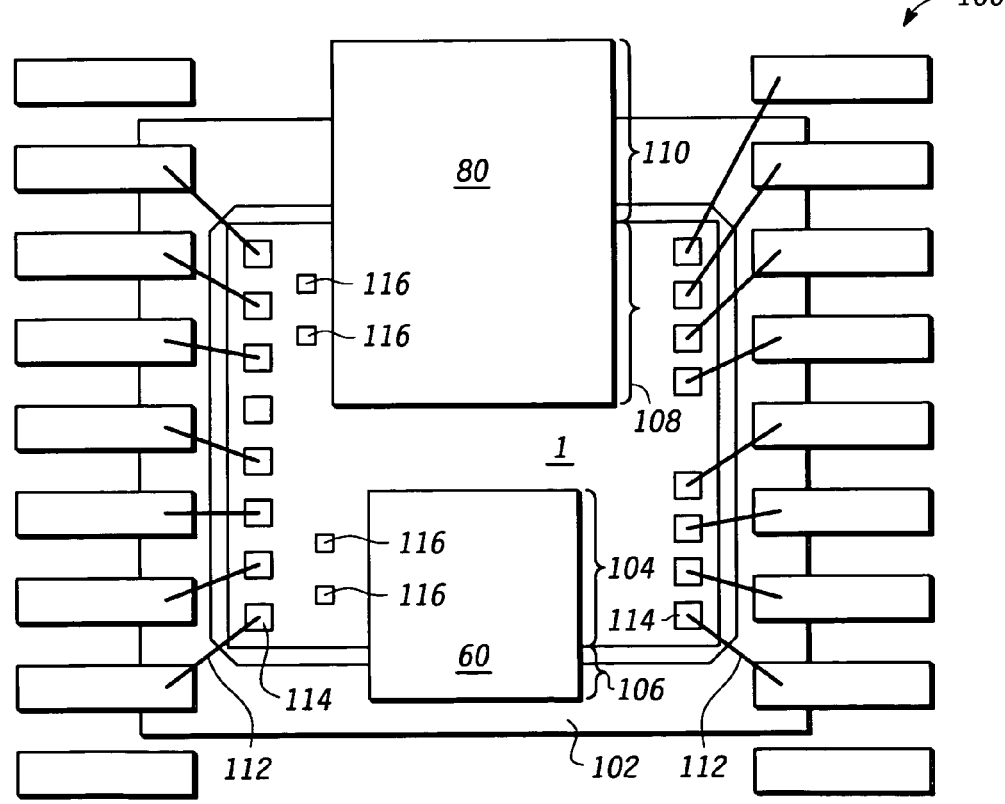
FIG. 8 is a top view of a semiconductor package having the semiconductor devices of FIG. 7, in accordance with an exemplary embodiment of the present invention.

FIG. 8 is a top view of packaged multi-chips semiconductor device assembly 100, in accordance with an exemplary embodiment of the present invention. As illustrated in FIG. 8, first semiconductor device 1 may be mounted onto a package flag 102 (which may also be referred to as a lead frame) using conventional methods, such as epoxy die attachment. In one embodiment of the invention, second semiconductor device 60 may be electrically coupled to and may overlie semiconductor device 1. In one embodiment of the invention, the entire second semiconductor device 60 may overlie semiconductor device 1. In another embodiment of the invention, a first portion 104 of second semiconductor device 60 may overlie first semiconductor device 1 and a second portion 106 may extend in a cantilever manner from first portion 104. In this regard, if second portion 106 of second semiconductor device 60 may emit signals, such as from resistor/capacitor circuits, inductor circuits, and/or other similar circuits, that may adversely affect the operation of semiconductor device 1, second portion 106 may be disposed remote from first semiconductor device 1 and instead may overlie package flag 102.

Referring still to FIG. 8, in another embodiment of the invention, multi-chips semiconductor device assembly 100 may also comprise third semiconductor device 80, which may be electrically coupled to and may overlie first semiconductor device 1. In one embodiment of the invention, the entire third semiconductor device 80 may overlie semiconductor device 1. In another embodiment of the invention, a first portion 108 of third semiconductor device 80 may overlie first semiconductor device 1 and a second portion 110 may extend in a cantilever manner from first portion 108, and also may extend beyond package flag 102.

Multi-chips semiconductor device assembly 100 also may include electrical connections from a surface of first semiconductor device 1 to package substrate 102. For example, in one embodiment, assembly 100 includes wire bonds 112 to electrically couple first semiconductor device 1 from a plurality of bond pads 114 to package flag 102, as is known in the art. Also, assembly 100 may include a mold compound (not shown) at least partially surrounding devices 1, 60, and 80, flag 102, wire bonds 112, and package flag 102 to complete package 100. The mold compound may be formed as is known in the art using materials as are known in the art. The mold compound also may be referred to as an encapsulant or may be a glob top, as is known in the art. Underfill material that may partly squeeze out from under semiconductor devices 60 and 80 is not shown.

Note that semiconductor device 1 also may include contacts 116 that may be used as probe sites. Probe tips may be placed on contacts 116 to electrically test semiconductor device 1. In addition, because semiconductor device 60 and semiconductor device 80 are each in electrical contact with semiconductor device 1, devices 60 and 80 also may be tested via contacts 116. Alternatively, bond pads 114 may be used as probe sites for the testing of devices 1, 60 and/or 80.

While FIG. 8 illustrates two chips overlying and in electrical contact with semiconductor device 1, one, two, three, or any suitable number of semiconductor chips may be stacked on semiconductor device 1 as described above. It will be appreciated that, in accordance with the various embodiments of the present invention, one or more chips may be stacked on semiconductor device 1 without requiring the thinning of the overlying chips or the thinning of semiconductor device 1. In this manner, the structural integrity of the stacked chips may be maintained. In addition, by the elimination of a thinning step during processing, processing time may be decreased while package yield may be increased. In an alternative embodiment, the overlying chips and/or semiconductor device 1 may be thinned to allow fabrication of an even thinner package.

Accordingly, multi-chips semiconductor device assemblies with multiple chips electrically and physically mounted directly to a first chip have been described. The assemblies provide for the increased functionality of a semiconductor device assembly package while minimizing the size of the package. The assemblies also provide for the cantilever mounting of a second chip onto a first chip to minimize electrical cross-chip interference. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for fabricating a semiconductor device assembly, the method comprising:

providing a first integrated circuit chip having a first surface, a plurality of conductive contacts disposed at said first surface, and a plurality of integrated circuits, each of said plurality of integrated circuits electrically coupled to at least one of said plurality of conductive contacts, depositing an organic cushioning layer over said first integrated circuit chip;

patterning said organic cushioning layer to form a plurality of openings to expose at least the conductive contacts;

depositing a robust metal layer overlying said integrated circuits and filling said plurality of openings;

patterning said robust metal layer to form a plurality of robust metal portions, at least some of which serve as landing pads, wherein the robust metal portions spatially redistribute at least one of said plurality of conductive contacts, wherein each robust metal portion comprises a single contiguous metal or alloy, and directly contacts at least one of the plurality of conductive contacts and can withstand high current operation therethrough, and wherein at least one of said plurality of robust metal portions at least partially overlies the organic cushioning layer such that the robust metal portion can withstand impact stresses;

disposing a first portion of a second integrated circuit chip overlying at least a first portion of said first integrated circuit chip so that a second portion of said second integrated circuit chip extends beyond said first integrated circuit chip, wherein said second integrated circuit chip has a second surface and comprises a plurality of first bonding members disposed at said second surface and said second surface is disposed adjacent said first surface of said first integrated circuit chip;

disposing a first portion of a third integrated circuit chip overlying at least a second portion of said first integrated circuit chip so that a second portion of said third integrated circuit chip extends beyond said first integrated circuit chip, wherein said third integrated circuit chip has a third surface and comprises a plurality of second bonding members disposed at said third surface and said third surface is disposed adjacent said first surface of said first integrated circuit chip;

bonding each one of a first set of said plurality of bonding members to one of said plurality of robust metal portions; and bonding each of a first set of said plurality of second bonding member to one of said plurality of robust metal portions;

depositing an underfill material on said first surface of said first integrated circuit chip; and curing said underfill material.

2. The method for fabricating a semiconductor device assembly of claim 1, wherein said first set of said plurality of first bonding members is disposed at said first portion of said second integrated circuit chip.

3. The method for fabricating a semiconductor device assembly of claim 1, wherein a second set of said plurality of bonding members is disposed at said second portion of said second integrated circuit chip.

4. The method for fabricating a semiconductor device assembly of claim 1, wherein each of said plurality of first bonding members comprises a solder material and the step of bonding each one of a first set of said plurality of first bonding members to one of said plurality of conductive pads comprises reflowing each one of said first set of said plurality of first bonding members.

5. The method for fabricating a semiconductor device assembly of claim 1, wherein said underfill material comprises a no-flow underfill material and the step of depositing an underfill material is performed before the step of bonding.

6. The method for fabricating a semiconductor device assembly of claim 5, wherein the steps of bonding and curing are performed substantially simultaneously.

7. The method for fabricating a semiconductor device assembly of claim 1, wherein said first integrated circuit chip comprises a plurality of contacts adapted to be used as probe sites, and wherein said method further comprises the step of placing probe tips on the plurality of contacts to electrically test said first integrated circuit chip.

8. The method for fabricating a semiconductor device assembly of claim 7, wherein said second integrated circuit chip further comprises a plurality of integrated circuits, wherein each one of said plurality of integrated circuits of said second integrated circuit chip is in electrical communication with a corresponding bonding member, and wherein the method further comprises the step of placing probe tips on the plurality of contacts to electrically test said second integrated circuit chip.

9. The method of claim 1, wherein forming the robust metal portion comprises forming a power metal layer.

10. The method of claim 9, wherein forming the robust metal portion comprises forming a power copper layer.

11. The method of claim 10, wherein forming the robust metal portion comprises forming a power copper layer having a thickness greater than 4 microns.

12. The method of claim 10, wherein forming the robust metal portion includes forming a robust metal portion configured high current operation of least about 15 Amps.

* * * * *